(12) United States Patent
Chen et al.

(10) Patent No.: US 9,244,253 B2
(45) Date of Patent: *Jan. 26, 2016

(54) SMALL FORM FACTOR HIGH-RESOLUTION CAMERA

(71) Applicant: Apple Inc., Cupertino, CA (US)

(72) Inventors: Xi Chen, San Jose, CA (US); David S. Gere, Palo Alto, CA (US); Matthew C. Waldon, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/804,088

(22) Filed: Jul. 20, 2015

(65) Prior Publication Data

US 2015/0323761 A1 Nov. 12, 2015

Related U.S. Application Data

(63) Continuation of application No. 13/785,458, filed on Mar. 5, 2013, now Pat. No. 9,086,558.

(51) Int. Cl.
*G02B 13/00* (2006.01)
*H04N 5/225* (2006.01)
*H04N 5/369* (2011.01)

(52) U.S. Cl.
CPC ............ *G02B 13/002* (2013.01); *H04N 5/2253* (2013.01); *H04N 5/2257* (2013.01); *H04N 5/3696* (2013.01)

(58) Field of Classification Search
None
See application file for complete search history.

(56) References Cited

U.S. PATENT DOCUMENTS

| 7,923,793 | B2 | 4/2011 | Choi et al. | |
|---|---|---|---|---|
| 9,086,558 | B2 | 7/2015 | Chen et al. | |
| 2006/0091289 | A1* | 5/2006 | Cooper | H04N 5/262 250/208.1 |
| 2012/0147207 | A1 | 6/2012 | Itonaga | |
| 2012/0162483 | A1 | 6/2012 | Sutton et al. | |

FOREIGN PATENT DOCUMENTS

WO 0129613 A1 4/2001

OTHER PUBLICATIONS

Iwert, Olaf, and Delabre, Bernad, "The challenge of highly curved monolithic imaging detectors," SPIE Astronomical Telescopes and Instrumentation: Observational Frontiers of Astronomy for the New Decade. International Society for Optics and Photonics, 2010, pp. 1-6.

* cited by examiner

*Primary Examiner* — Sath V Perungavoor
*Assistant Examiner* — Janese Duley
(74) *Attorney, Agent, or Firm* — Robert C. Kowert; Meyertons, Hood, Kivlin, Kowert & Goetzel, P.C.

(57) ABSTRACT

A camera including a spherically curved photosensor and a lens system. Effective focal length f of the lens system is within about 20% of the radius of curvature of the photosensor. An image is formed by the lens system at a spherically curved image plane that substantially matches the concave surface of the photosensor. The camera is diffraction-limited with small spot size, allowing small pixels to be used in the photosensor. F/number may be 1.8 or less. The spherically curved image plane formed by the lens system at the photosensor follows f*θ image height law. Chief rays of the lens system are substantially normal to the concave surface of the photosensor. Total axial length of the camera may be 2.0 mm or less. The camera may be implemented in a small package size while still capturing sharp, high-resolution images, making the camera suitable for use in small devices.

20 Claims, 11 Drawing Sheets

| optical surface | radius of curvature (RoC) | thickness | conic constant | 4th-order aspheric coefficient | 6th-order aspheric coefficient | 8th-order aspheric coefficient | 10th-order aspheric coefficient |
|---|---|---|---|---|---|---|---|
| lens element 412, surface 430 | 1.169 | 0.424 | 0 | -0.264 | -0.519 | -0.316 | 0 |
| lens element 412, surface 432 | -3.407 | 0.102 | 0 | -0.223 | -0.215 | 0.155 | -0.122 |
| Stop | infinity | 0.161 | 0 | 0 | 0 | 0 | 0 |
| lens element 414, surface 440 | 1.421 | 0.479 | -2.072 | 0 | 0.376 | -3.144 | 2.462 |
| lens element 414, surface 442 | -0.876 | 0.100 | 0 | 0.468 | -2.332 | 0.261 | 0 |
| lens element 416, surface 450 | -0.866 | 0.394 | 0 | 0.300 | -1.584 | -9.225 | 22.116 |
| lens element 416, surface 452 | -1.524 | 0.291 | 0 | 0.321 | -0.400 | -0.676 | 1.425 |
| image plane (photosensor 420) | -1.304 | - | 0 | 0 | 0 | 0 | |

FIG. 4B

SMALL FORM FACTOR HIGH-RESOLUTION CAMERA

This application is a continuation of U.S. patent application Ser. No. 13/785,458, filed Mar. 5, 2013, now U.S. Pat. No. 9,086,558, which is hereby incorporated by reference in its entirety.

BACKGROUND

1. Technical Field

This disclosure relates generally to camera systems, and more specifically to high-resolution, small form factor camera systems.

2. Description of the Related Art

The advent of small, mobile multipurpose devices such as smartphones and tablet or pad devices has resulted in a need for high-resolution, small form factor cameras for integration in the devices. However, due to limitations of conventional camera technology, conventional small cameras used in such devices tend to capture images at lower resolutions and/or with lower image quality than can be achieved with larger, higher quality cameras. Note that conventional small cameras use planar photosensors, and the image plane formed by the lens system at the photosensor of such cameras follows conventional $f*\tan(\theta)$ image height law. Achieving higher resolution with small package size cameras requires use of a photosensor with very small pixel size (e.g., <1.2 microns) and a very good imaging lens system. However, achievable resolution using conventional lens systems for small cameras has not been sufficient for such small pixels due to factors such as the z-height constraint, limitations on achievable F/number, and manufacturing constraints.

SUMMARY OF EMBODIMENTS

Embodiments of the present disclosure may provide a high-resolution camera in a small package size. A camera is described that includes a spherically curved photosensor and a lens system. In at least some embodiments, the effective focal length (f) of the lens system is within about 20% of the radius of curvature (RoC) of the photosensor. The lens system may include in-line lens elements that refract light from an object field to form an image on the concave surface of the photosensor. In some embodiments, a first lens element refracts light from the object field through a stop to a second lens element, and the second lens element refracts light received from the first lens element to form the image of the object field at the surface of the photosensor. The image is formed by the lens system at a spherically curved image plane that substantially matches the concave surface of the photosensor. In at least some embodiments, paraxial image height of the image formed on the concave surface of the photosensor by the lens system is substantially equal to $f*\theta$, where $\theta$ (theta) is the deflection angle of the lens system. Thus, the lens system is an $f*\theta$ lens system, and the spherically curved image plane formed by the lens system at the photosensor follows $f*\theta$ image height law. Chief rays of the lens system are substantially normal to the concave surface of the photosensor. In at least some embodiments, F/number of the lens system, determined by the effective focal length (f) of the lens system and the diameter D of the entrance pupil, may be 1.6.

In some embodiments, the lens system may further include a third lens element, positioned between the first two lens elements and the photosensor, with optical characteristics that correct for chromatic aberration of the first and second lens elements.

Optical characteristics of the lens system may provide very small ray fan spot size for all field heights at the image plane, as well as a very small spot size for all field heights. In addition, the lens system is diffraction-limited over the entire photosensor. This allows a small photosensor with small pixel size (e.g., less than 1.2 microns, for example 1.1 microns) to be used in the camera while still providing sharp, high-resolution images. In at least some embodiments, total axial length of the camera may be 2.0 millimeters (mm) or less. Thus, the camera may be implemented in a small package size while still capturing sharp, high-resolution images, making embodiments of the camera suitable for use in small and/or mobile multipurpose devices such as cell phones, smartphones, pad or tablet computing devices, laptop, netbook, notebook, subnotebook, and ultrabook computers.

Images captured using the camera may include barrel distortion. Embodiments of the camera may include or leverage an implementation of a distortion correcting algorithm that may be applied to images captured by the camera system to correct for barrel distortion. Any of various algorithms for correcting barrel distortion may be used.

BRIEF DESCRIPTION OF THE DRAWINGS

FIGS. 4A and 4B illustrate example values for various parameters of the lens system and photosensor of a camera as illustrated in FIG. 1.

Figure 1:
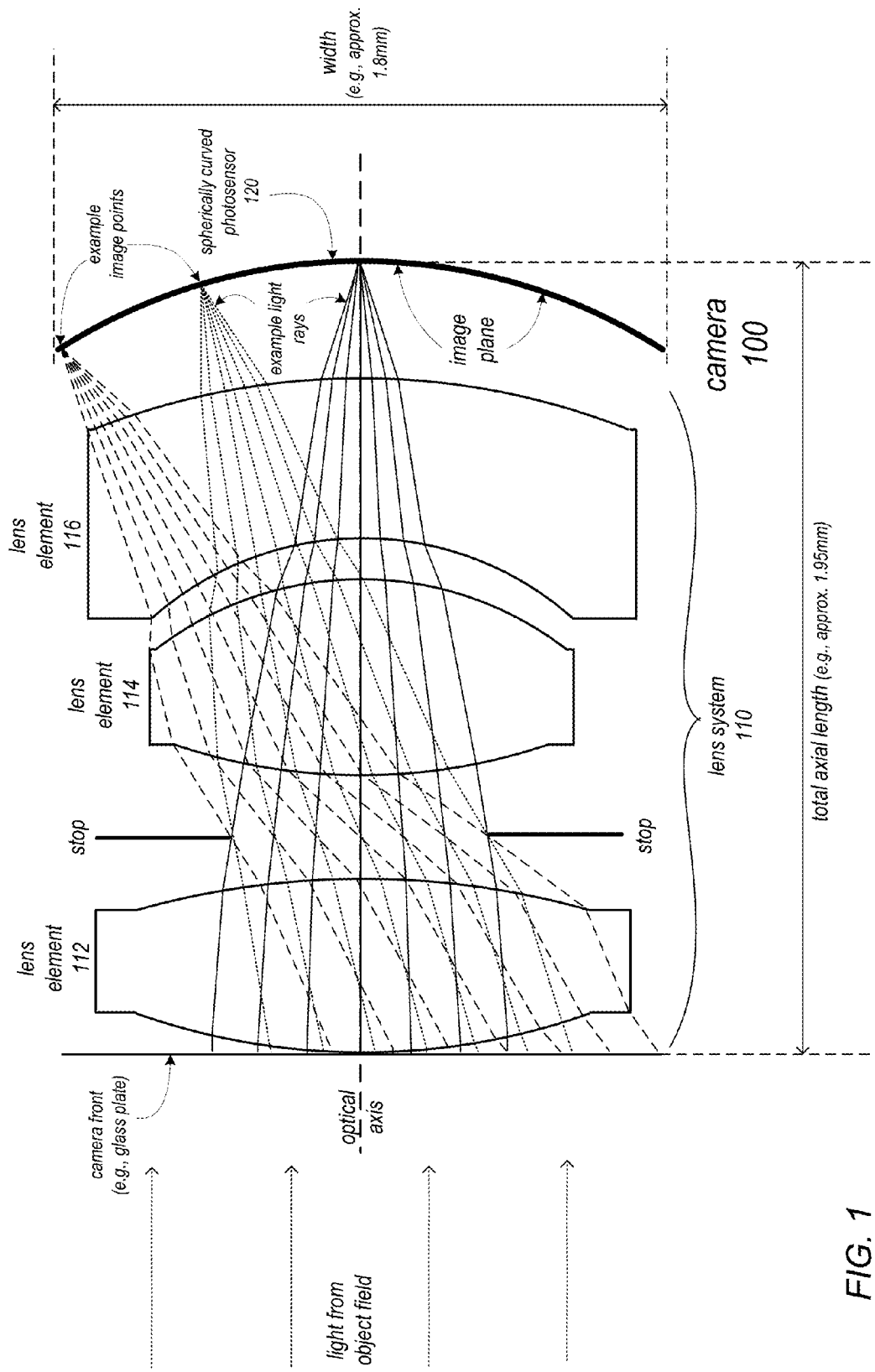
FIG. 1 illustrates a camera including a lens system with three lens elements and a spherically curved photosensor, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units...." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Embodiments of a camera including a spherically curved photosensor and a lens system are described. The lens system may include two in-line lens elements that refract light from an object field to form an image on the concave surface of the photosensor. A stop may be located between the two lens elements. In at least some embodiments, F/number of the lens system, determined by the effective focal length (f) of the lens system and the diameter D of the entrance pupil, may be 1.8 or less. As an example, in some embodiments, F/number of the lens system may be 1.6. A first lens element refracts light from the object field through the stop, and a second lens element refracts light received from the first lens element to form the image of the object field at the surface of the photosensor. In at least some embodiments, the effective focal length (f) of the lens system is within about 20% of the radius of curvature of the photosensor. The image is formed by the lens system at a spherically curved image plane that substantially matches the concave surface of the photosensor. In at least some embodiments, paraxial image height of the image formed on the concave surface of the photosensor by the lens system is substantially equal to f*θ, where θ (theta) is the deflection angle of the lens system. Chief rays of the lens system are substantially normal to the concave surface of the photosensor. The spherically shaped photosensor surface helps to dramatically reduce the field curvature of the lenses. Using a curved photosensor, the field curvature does not need to be well corrected for an imaging system with large field of view.

In at least some embodiments, the lens system may further include a third lens element positioned between the first two lens elements and the photosensor. A third lens element may be selected with optical characteristics that correct for chromatic aberration of the first and second lens elements. In other words, the third lens element may be used to make the lens system achromatic. For example, in some embodiments, a third lens element may be used that is composed of a transparent material that has a lower Abbe number (also referred to as the V-number or constringence) than the transparent material used in the first and second lens elements. In optics, the Abbe number of an optically transparent material is a measure of the material's dispersion (variation of refractive index with wavelength) in relation to the refractive index of the material. A lower Abbe number represents a more dispersive transparent material. The use of an appropriately designed third lens element of a material with a low Abbe number may act to correct for chromatic aberration of the first two lens elements.

Optical characteristics of the lens system may provide very small ray fan spot size for all field heights at the image plane, as well as a very small spot size for all field heights. In addition, the lens system is diffraction-limited over the entire photosensor. This allows a photosensor with small pixel size (e.g., less than 1.2 microns, for example 1.1 microns) to be used in the camera while still providing sharp, high-resolution images. In addition, the lens system may include only two lens elements in some embodiments, or three lens elements in embodiments where a third lens element is used to correct for chromatic aberration, which reduces the axial (or z) length of the lens system and camera when compared to conventional lens systems for small cameras. In at least some embodiments, total axial length of the camera may be 2.0 millimeters (mm) or less. In some embodiments, total axial length of the camera may be 1.95 mm or less. Width of the camera may be 2.0 mm or less. Thus, the camera may be implemented in a small package size while still capturing sharp, high-resolution images, making embodiments of the camera suitable for use in small and/or mobile multipurpose devices such as cell phones, smartphones, pad or tablet computing devices, laptop, netbook, notebook, subnotebook, and ultrabook computers, and so on. Note that aspects of the lens system and photosensor may be scaled up or down to provide cameras with larger or smaller package sizes.

Figure 7:
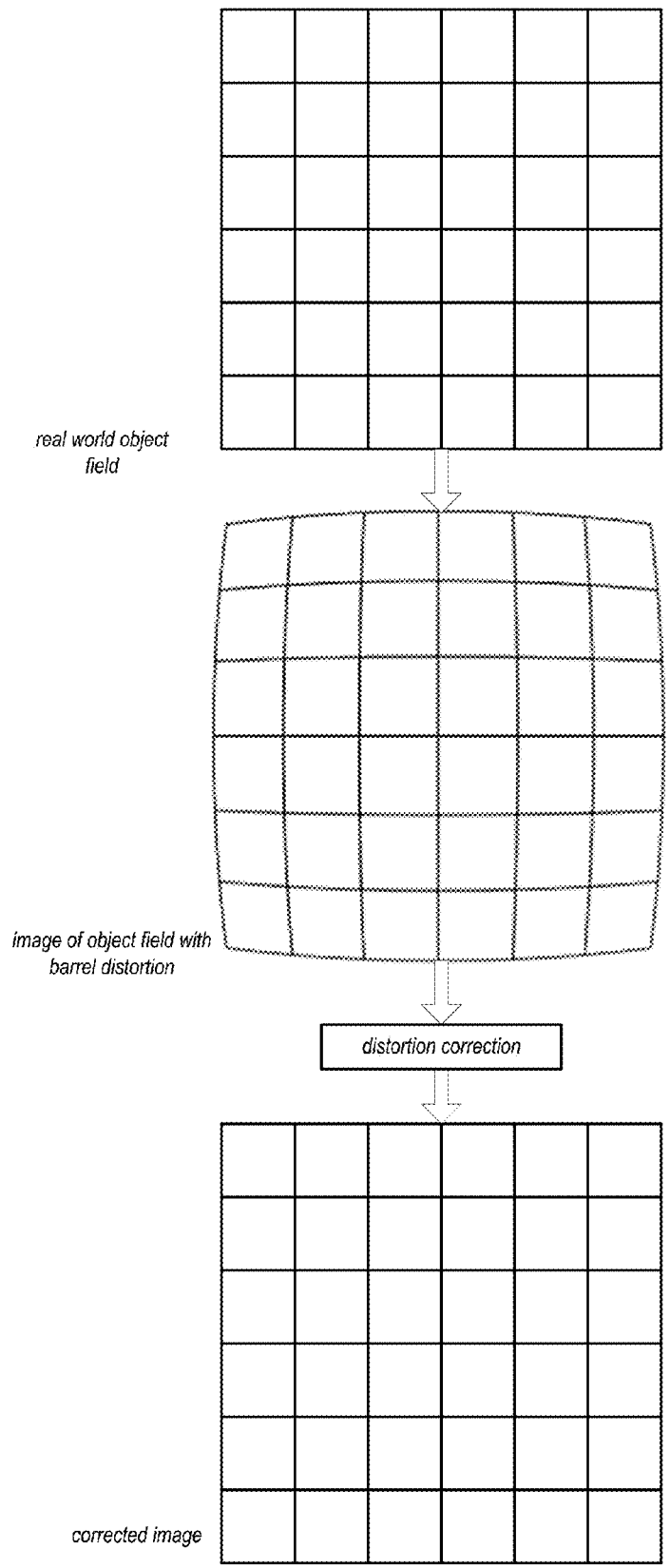
FIG. 7 illustrates barrel distortion and distortion correction in a camera as illustrated in FIG. 1.

A tradeoff is made in the camera design as described herein in that imaged captured by the spherically-curved photosensor include geometric (barrel) distortion. See FIG. 7 for a graphical illustration of barrel distortion in a captured image of an object field introduced by a camera system. At least some embodiments may include or leverage a distortion correcting algorithm that may be applied to images captured by the camera system to correct for barrel distortion, as shown in FIG. 7. Any of various image processing algorithms for correcting barrel distortion in digital images as known in the art may be used. Commercial or custom implementations of the image processing algorithms may be used in various embodiments.

Embodiments of the camera system may, for example, be implemented as a camera in various multipurpose computing devices, including but not limited to small and/or mobile devices such as cell phones, smartphones, pad or tablet computing devices, and laptop, netbook, notebook, subnotebook, and ultrabook computers. In addition, embodiments of the camera system may be implemented as stand-alone digital cameras. In addition to still (single frame capture) camera applications, embodiments of the camera system may be adapted for use in video camera applications.

FIG. 1 illustrates a camera including a lens system with three lens elements and a spherically curved photosensor, according to some embodiments. Camera 100 may include a lens system 110 that acts as an imaging lens for the camera, and a spherically curved photosensor 120 onto which lens system 110 projects an image at a spherically curved image plane that substantially coincides with the concave surface of the photosensor 120. Lens system 110 includes three lens elements: lens elements 112, 114, and 116.

Lens elements 112 and 114 may be referred to as a first lens element and a second lens element, respectively. In at least some embodiments, lens elements 112 and 114 are both biconvex lenses (also referred to as convex or positive lenses) that refract light received from an object field in front of the camera 100 and act together to focus the light rays at a spherically curved image (or focal) plane at focal length f of the lens system. In at least some embodiments, lens elements 112 and 114 may be composed of a moldable glass material. However, other transparent materials may be used. Lens elements 112 and 114 may be, but are not necessarily, composed of the same material.

Figure 2:
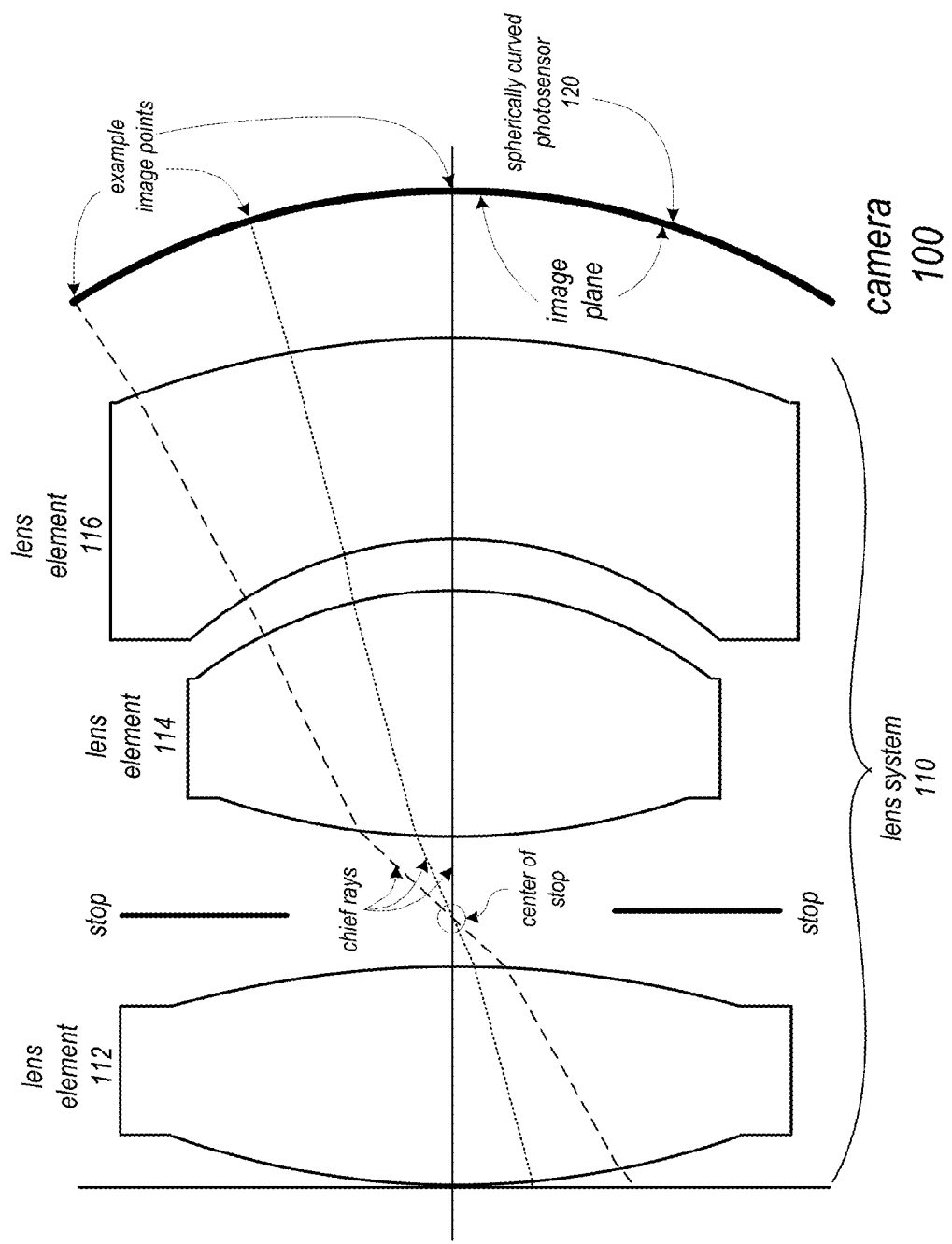
FIG. 2 illustrates chief rays in a camera as illustrated in FIG. 1.

In at least some embodiments, lens system 110 is a mid-aperture lens system. That is, the stop (aperture) is located between lens elements 112 and 114, as shown in FIG. 1. Note that, in optics, chief rays are the light rays that pass through the center of the stop, as shown in FIG. 2. In at least some embodiments, the aperture (entrance pupil) of the stop may be designed to provide a low F/number equal to or less than 1.8 for lens system 110. In some embodiments, for example, F/number of lens system 110 may be 1.6 (f/1.6). In optics, the F/number is the ratio of the focal length f of the lens system to the diameter of the aperture D (f/D). For example, in some embodiments, lens system 110 may have focal length f of approximately 1.2 mm. To achieve f/1.6 with f=1.2 mm, diameter D of the aperture would be approximately 0.75 mm. One of ordinary skill in the art will recognize that f and/or D may be scaled to produce f/1.6 for camera 110 or to provide other F/numbers for camera 100.

Lens element 116 may be referred to as a third lens element. In at least some embodiments, lens element 116 is a meniscus lens (a lens with a concave surface and a convex surface). The concave surface faces the first and second lens elements, and thus the front of the camera, and the convex surface faces the photosensor 120. In at least some embodiments, lens element 116 is a negative meniscus lens. In a negative meniscus lens, the radius of curvature of the concave surface is less than the radius of curvature of the convex surface, and thus the lens is thinner at the center (at the optical axis) than at the edges. In at least some embodiments, lens element 116 may be composed of an injection molded plastic material. However, other transparent materials may be used. In at least some embodiments, lens element 116 may be composed of a material that has an Abbe number approximately opposite of the Abbe number of the material used in lens elements 112 and 114 to correct for chromatic aberration of lens elements 112 and 114, thus making lens system 110 achromatic.

Figure 6:
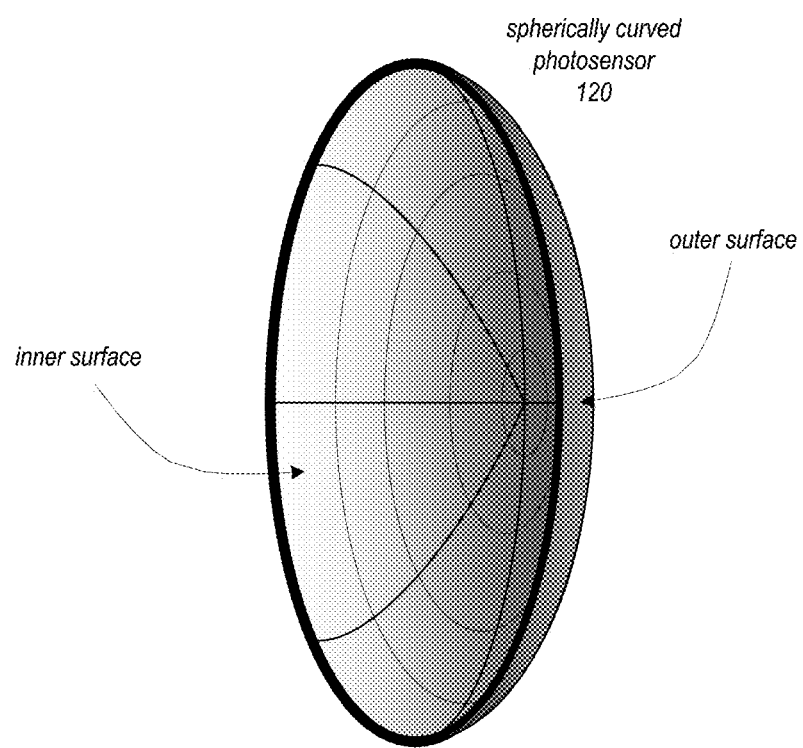
FIG. 6 shows a three-dimensional oblique view of a spherically curved photosensor, according to at least some embodiments.

Spherically curved photosensor 120 may be an integrated circuit (IC) technology chip or chips implemented according to any of various types of photosensor technology. Examples of photosensor technology that may be used are charge-coupled device (CCD) technology and complementary metal-oxide-semiconductor (CMOS) technology. In at least some embodiments, pixel size of the photosensor 120 may be 1.2 microns or less, although larger pixel sizes may be used. In an example embodiment, pixel size of the photosensor 120 may be 1.1 microns. In an example embodiment, photosensor 120 may be manufactured according to a 1280×720 pixel image format to capture 1 megapixel images. Other pixel formats may be used in embodiments, for example 5 megapixel or 10 megapixel formats. Note that the camera system 100 may need to be appropriately scaled to support the larger formats. FIG. 6 shows a three-dimensional oblique view of an example spherically curved photosensor 120 according to at least some embodiments, and is not intended to be limiting. Note that the photosensor 120 in this example is shaped like a slice off a hollow sphere. An array of light-capturing pixel elements is located on the inner surface. The outer surface may include connectors, pins, and/or other components for coupling the photosensor 120 to other components within a device such as busses or other ICs.

Referring again to FIG. 1, lens system 110 acts to form a spherically curved image plane at or near the concave surface of spherically curved photosensor 120. As shown in FIG. 1, particular groups of light rays are focused by lens system 110 at particular image points on the image plane. Example light rays are shown for three groups of light rays that are focused at three example image points. For clarity, FIG. 2 shows the optical paths of only the chief rays of the three groups of light rays shown in FIG. 1. Chief rays are the rays that pass through the center of the stop. Note that the light ray represented as a solid line in FIG. 2 is the chief ray along the optical axis of the camera 100.

Figure 3:
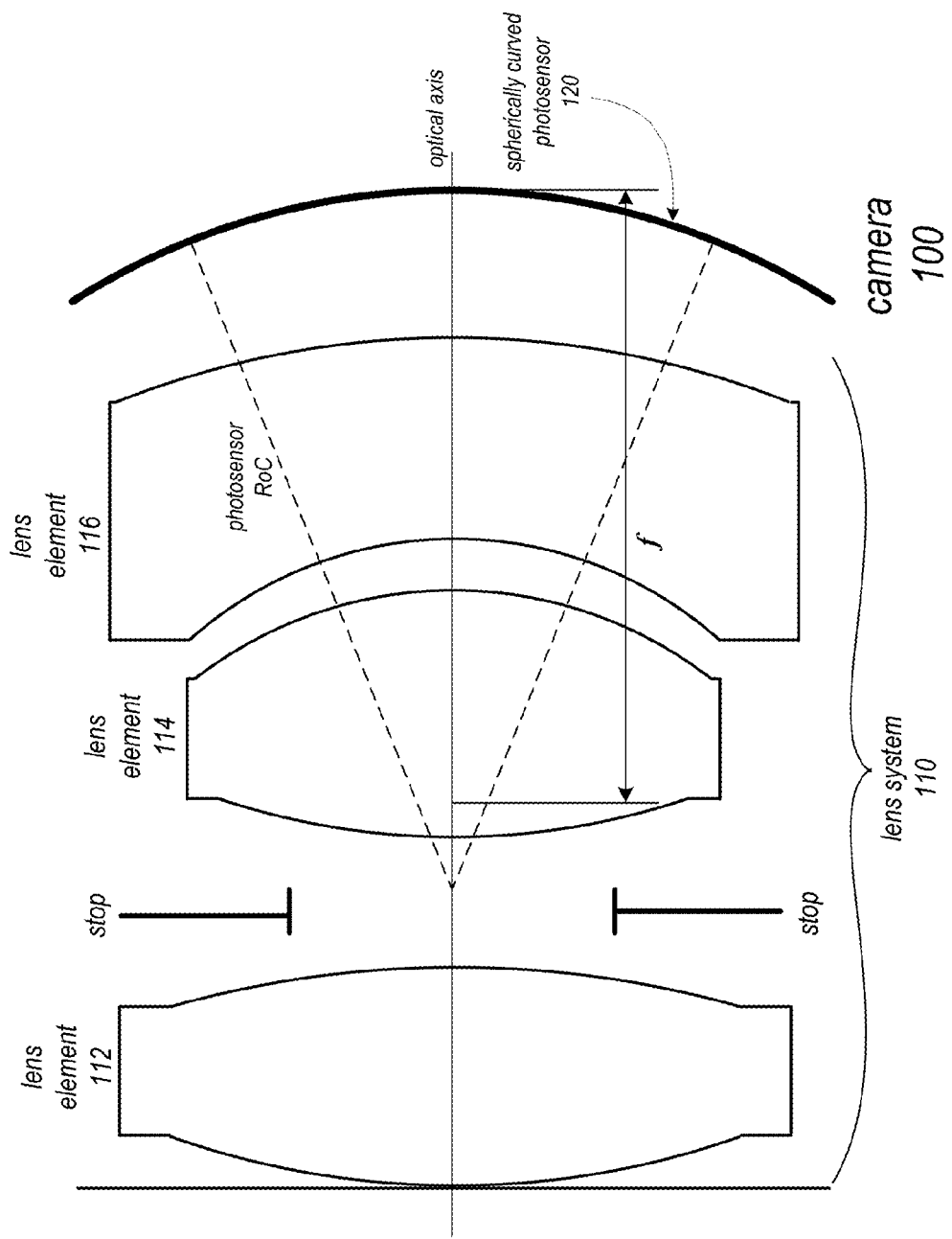
FIG. 3 illustrates the relationship between the radius of curvature of the spherically curved photosensor and the effective focal length of the lens system in a camera as illustrated in FIG. 1.

As shown in FIG. 3, to form a spherically curved image plane at or near the surface of photosensor 120, the radius of curvature (RoC) of the photosensor 120 is selected to be close to the effective focal length f of lens system 110. Alternatively, focal length f of lens system 110 may be selected to be close to the RoC of the photosensor 120 via appropriate selection of lens elements. For example, in some embodiments, the RoC of the photosensor may be within 15% of f. In some embodiments, the RoC of the photosensor may be within 12% off. In some embodiments, the RoC of the photosensor may be within 10% of f. In some embodiments, the RoC of the photosensor may be substantially equal to f.

Optical characteristics of the lens system 110 provide very small ray fan spot size for all field heights at the image plane. In addition, the lens system 110 is diffraction-limited over the entire image plane/photosensor 120. Paraxial image height of the image formed on the concave surface of the photosensor 120 by the lens system 110 is substantially equal to f*θ, where θ (theta) is the deflection angle of the lens system 110. Chief rays of the lens system 110 (see FIG. 3) are substantially normal to the concave surface of the photosensor 120. In some embodiments, for example, the maximum chief ray angle is below 2° for a half diagonal field of view above 30°. The point spread function (PSF) and modulation transfer function (MTF) of lens system 110 are very uniform over the photosensor 120. For example, in some embodiments, the PSF Strehl ratio is above 0.94 everywhere over the photosensor 120. Note that the Strehl ratio is the ratio of the actual PSF to the PSF of an ideal, aberration-free lens. Note that a lens system is considered to be diffraction-limited if the Strehl ratio is above 0.85, so lens system 110 is a diffraction-limited lens system. In addition, relative illumination in lens system 110 is above 80% for a half-diagonal field of view above 30°.

Example Lens System and Photosensor Parameters

Figure 4A:
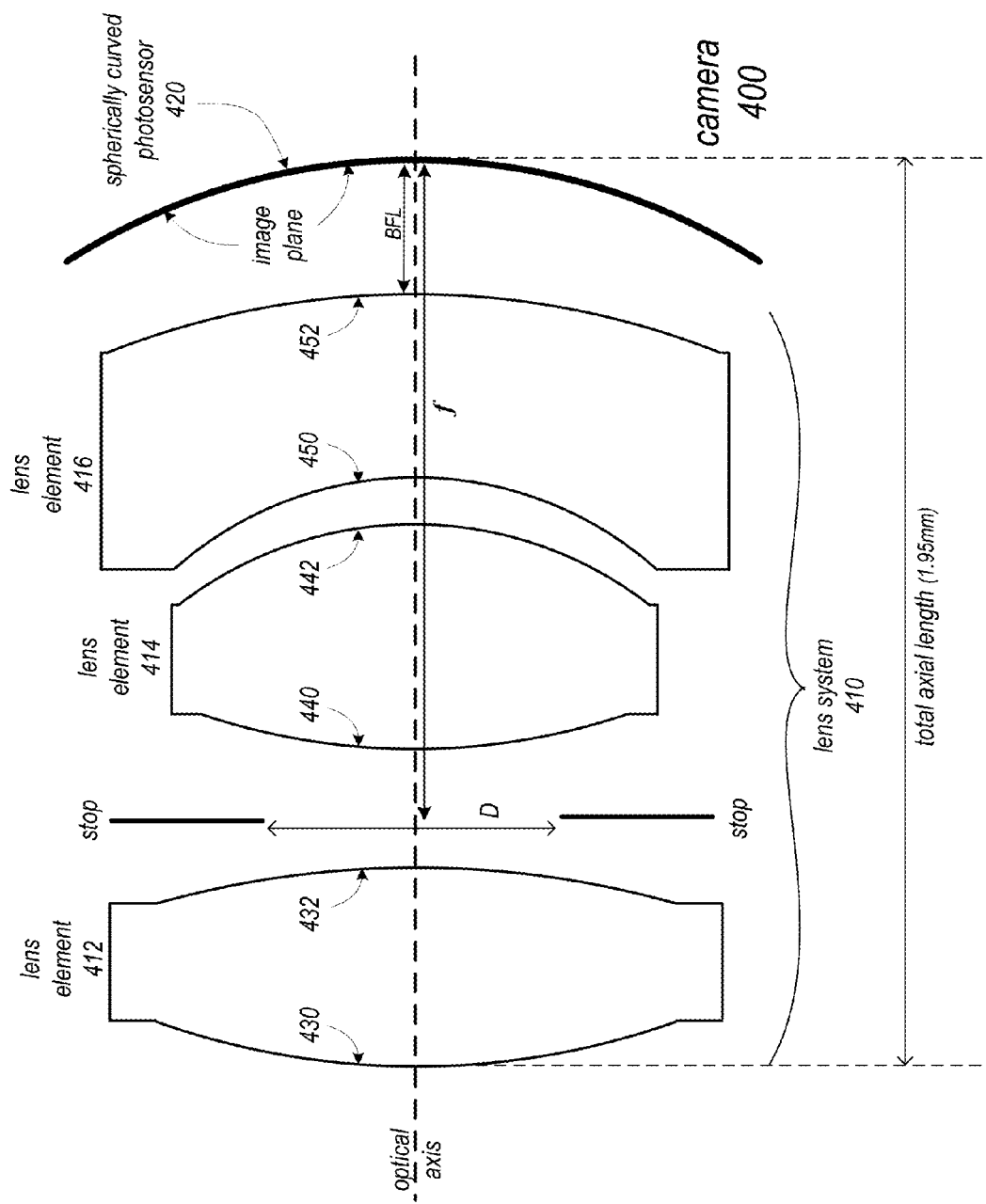

This section describes an example configuration for a camera 400, with example values for various parameters of the lens system 410 and photosensor 420 with reference to FIGS. 4A and 4B. These parameter values may, for example, be specified to manufacture the lens elements 412, 414, and 416 and of photosensor 420. Note that the example values are not intended to be limiting. Also note that the values can be scaled to produce larger or smaller cameras, and/or cameras with different image formats or sizes (e.g., 5 megapixel image cameras rather than 1 megapixel image formats).

FIG. 4A shows an example camera 400 including lens system 410 and photosensor 420, according to at least some embodiments. Lens system includes lens elements 412, 414, and 416, and a stop. Lens system 410 is a mid-aperture lens system, with the stop located between lens elements 412 and 414. Lens elements 412 and 414 may be composed of a moldable glass material. Lens element 416 may be composed of an injection molded plastic material. Optical characteristics of the material of which lens element 416 is composed may be chosen to correct for chromatic aberration of lens elements 412 and 414.

The inner and outer surface of each of lens elements 412, 414, and 416 are labeled with numbers in FIG. 4A; the numbers are used to reference rows in the Table shown in FIG. 4B. The outer surfaces of the lens elements are those facing the front of the camera 400; the inner surfaces of the lens elements are those facing the photosensor 410. The outer and inner surfaces of lens element 412 are labeled 430 and 432, respectively. The outer and inner surfaces of lens element 414 are labeled 440 and 442, respectively. The outer and inner surfaces of lens element 416 are labeled 450 and 452, respectively.

FIG. 4B is a Table of values for parameters of surfaces of lens elements 412, 414, and 416, photosensor 420, and the stop, according to some embodiments. The first column lists the optical surfaces in the camera 400 according to the labels in FIG. 4A. The remaining columns show example values for radius of curvature (RoC), thickness, conic constant, and $4^{th}$, $6^{th}$, $8^{th}$, and $10^{th}$ order aspheric coefficients for the optical surfaces listed in column 1, where relevant. The values given in FIG. 4B are not intended to be limiting. One or more of the parameters for one or more of the surfaces may be given different values while still providing similar performance. In particular, note that the values in FIG. 4B may be scaled up or down for larger or smaller implementations of the camera 400. Also note that the RoC of the optical surfaces are shown as positive or negative. The sign of an RoC indicates that the curvature is positive or negative with respect to a camera reference point; all of the surfaces share the same reference point. In this case, the reference point is at the back of the camera 400 (the photosensor 420 side).

Using the example parameter values given in the Table in FIG. 4B, the following optical characteristics are obtained in the camera 400. Note that these values are given by way of example, and are not intended to be limiting. Similar or different optical characteristics may be obtained using variations of the parameter values in FIG. 4A.

The effective focal length (f) of lens system 410 is 1.205 mm. Effective focal length f of lens system 410 is the distance from the principle plane to the vertex of the image plane (i.e., at the vertex of the spherically curved surface of photosensor 420) along the optical axis. The RoC of the photosensor 420 is 1.364 mm. Thus, f in this example is @88.3% of the RoC of the photosensor, and the difference between f and RoC of the photosensor ((RoC−f/RoC) is @11.7%.

F/number of lens system 410 is f/1.6. To achieve f/1.6, diameter D of the entrance pupil of lens system 410 is approximately 0.75 mm. Smaller or larger F/numbers may be achieved by varying D and/or f, and f/1.6 may be achieved in a scaled-up or scaled-down camera 400 by appropriately scaling D and f. In some embodiments, the entrance pupil may be adjustable to give other values for D, and thus other F/numbers for the camera.

Back focal length (BFL) of lens system 410 is 0.291 mm. Back focal length of a lens system is the distance from the vertex of the last optical surface of the lens system (in this case, surface 452 of lens element 416) to the rear focal point at the vertex of the image plane (i.e., at the vertex of the spherically curved surface of photosensor 420) along the optical axis.

The lens system 410 includes only three lens elements, with the third lens element used to correct for chromatic aberration. This allows the axial (or z) length of the lens system 410 to be reduced when compared to conventional lens systems used in small package size cameras. Total axial length of the camera 400 is approximately 1.95 mm, allowing the camera to be implemented in a short front-to-back package size, making the camera 400 suitable for use in small and/or mobile devices. Width of the camera 400 may also be 2.0 mm or less. As previously noted, the camera parameters may be scaled up or down which may result in longer or shorter axial lengths and thus larger or smaller package sizes for some implementations of the camera 400.

The photosensor 420 may be a spherically curved image sensor comprising an array of light-sensing pixel elements on the spherically curved inner surface. Photosensor 420 may be implemented according to any of various types of photosensor technology. Examples of photosensor technology that may be used are charge-coupled device (CCD) technology and complementary metal-oxide-semiconductor (CMOS) technology. In at least some embodiments, the photosensor 420 may provide a high-definition, 1280×720 image format with a pixel size of 1.1 microns (μm). Lens system 410 affects light entering the front of the camera from an object field to form a spherically curved image plane at or near the spherically curved inner surface of photosensor 420.

Optical characteristics of the lens system 410 provide very small ray fan spot size for all field heights at the image plane/photosensor 420. In addition, the lens system 410 is diffraction-limited over the entire image plane/photosensor 420. Paraxial image height of the image formed on the concave surface of the photosensor 420 by the lens system 410 is substantially equal to f*θ, where θ (theta) is the deflection angle of the lens system 410. Thus, lens system 410 is an f*θ lens system, as opposed to a conventional f*tan(θ) lens system typically used in cameras. Chief rays of the lens system 410 (see FIG. 3) are substantially normal to the spherically curved inner surface of the photosensor 420. The maximum chief ray angle (CRA) is below 2° for a half diagonal field of view above 30°. This small CRA decreases sensor color crosstalk and increases sensor signal-to-noise ration (SNR). In addition, relative illumination in lens system 410 is above 80% for a half-diagonal field of view above 30°. The SNR at the edge of the image is higher than in conventional miniature cameras.

The point spread function (PSF) and modulation transfer function (MTF) of lens system 410 are very uniform over the photosensor 120. Lens system 410 is diffraction-limited; the PSF Strehl ratio of lens system 410 is above 0.94 everywhere over the photosensor 420.

The PSF (point-spread function) is an important and accurate metric used to evaluate a lens system's optical performance. The Strehl ratio of the PSF indicates how high the PSF peak is compared to an aberration-free lens. A lens system is generally considered diffraction-limited if the Strehl ratio is above 0.85. Lens system 410 has a Strehl ratio above 0.94 over the entire pixel sensor array of photosensor 420. Thus, lens system 410 is diffraction-limited. In addition, the modulation transfer function (MTF) of lens system 410, a measure of resolution (image sharpness) that the lens system is capable of, is very uniform over the entire field height. In addition, lens system 410 has a very small ray fan spot size for all field heights, and a very small spot size for all field heights.

The optical characteristics of lens system 410 make it possible to use lens system 410 with very small pixel sizes on photosensor 420, for example 1.2 micron, 1.1 micron, or even smaller pixel sizes, while still providing very sharp, high-resolution images. This ability to effectively use small pixels on photosensor 420 allows the photosensor 420 to be implemented that can capture sharp, high-resolution, 1 megapixel or larger images in a very small camera 400 package.

The spherically curved image plane formed by lens system 410 at photosensor 420 does not follow conventional f*tan(θ) image height law. Instead, lens system 410 is an f*θ lens system, and follows f*θ image height law. Lens system 410 introduces a small amount of optical distortion (less than 1%) if paraxial chief ray height is calculated as f*θ. However, with the conventional definition of distortion which has paraxial chief ray height calculated as f*tan(8), the distortion may be about 20%. Specifically, lens system 410 and spherically curved photosensor 420 result in some amount (less than 20%) of monotonically increasing barrel distortion in captured images (see FIG. 7). Embodiments may include or leverage a distortion correcting algorithm that may be applied to images captured by the camera system 400 to correct for barrel distortion, as shown in FIG. 7. The monotonically increasing barrel distortion in captured images makes distortion correction relatively straightforward, and the resulting distortion-corrected images are very accurate.

Camera 400 may be used for any imaging system that requires high resolution, high sensitivity, high SNR and small axial (or z) length. The lens system 410 and photosensor 420 design of camera 400 allows the camera 400 to be very small (e.g., 2 mm or less) in axial length and width, while providing sharp, high resolution, and fast image capture. Camera 400 may thus be implemented in a small package size while still capturing sharp, high-resolution images, making the camera suitable for use as a still camera or video camera in small and/or mobile multipurpose devices such as cell phones, smartphones, pad or tablet computing devices, laptop, netbook, notebook, subnotebook, and ultrabook computers, and so on.

Figure 8:
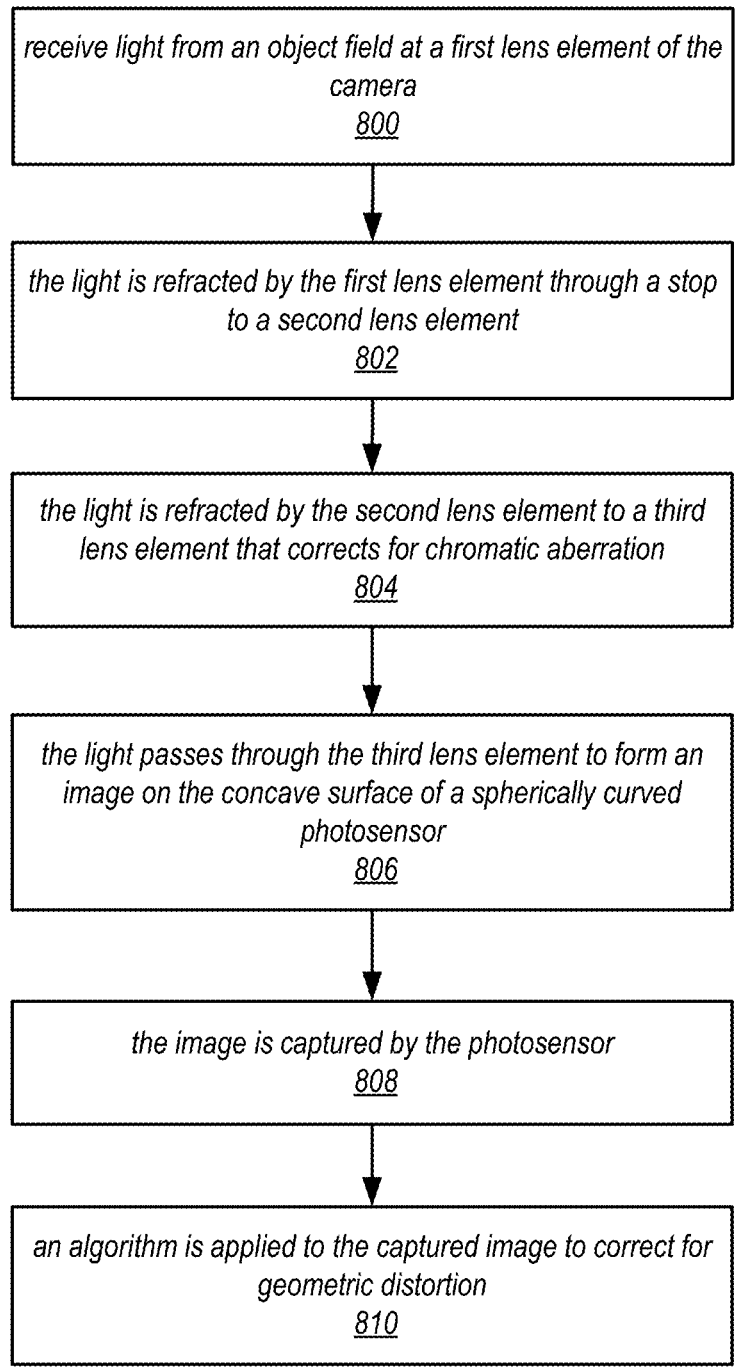
FIG. 8 is a flowchart of a method for capturing images using a camera as illustrated in FIGS. 1 through 4B, according to at least some embodiments.

FIG. 8 is a flowchart of a method for capturing images using a camera as illustrated in FIGS. 1 through 4B, according to at least some embodiments. As indicated at 800, light from an object field in front of the camera is received at a first lens element of the camera. As indicated at 802, the first lens element refracts the light through a stop to a second lens element. As indicated at 804, the light is then refracted by the second lens element to a third lens element that corrects for chromatic aberration. As indicated at 806, the light passes through the third lens element to form an image at a spherically curved image plane at or near the concave surface of a spherically curved photosensor. As indicated at 808, the image is captured by the photosensor. As indicated at 810, a distortion correction algorithm may then be applied to the captured image to correct for geometric (barrel) distortion. Note that applying the distortion correction algorithm may be optional.

In at least some embodiments, the first and second lens elements are both biconvex lenses that refract light received from an object field in front of the camera and that act together to focus the light rays at the spherically curved image (or focal) plane at focal length f of the lens system. In at least some embodiments, the third lens element is a negative meniscus lens. In at least some embodiments, the third lens element is composed of a material with different optical characteristics from the first two lens elements and acts to correct for chromatic aberration of the first two lens elements.

Alternative Embodiments

The camera as illustrated in FIGS. 1 through 4B may alternatively be implemented with two in-line lens elements instead of three in-line lens elements by leaving out the third lens element 116 and 416 in FIGS. 1 and 4A, respectively. The third lens element corrects for chromatic aberration, but otherwise does not have a significant effect on the image plane formed by the lens system. The remaining elements (the first two lens elements and the photosensor) may be appropriately adjusted to account for any differences in optical characteristics, if necessary.

Figure 5:
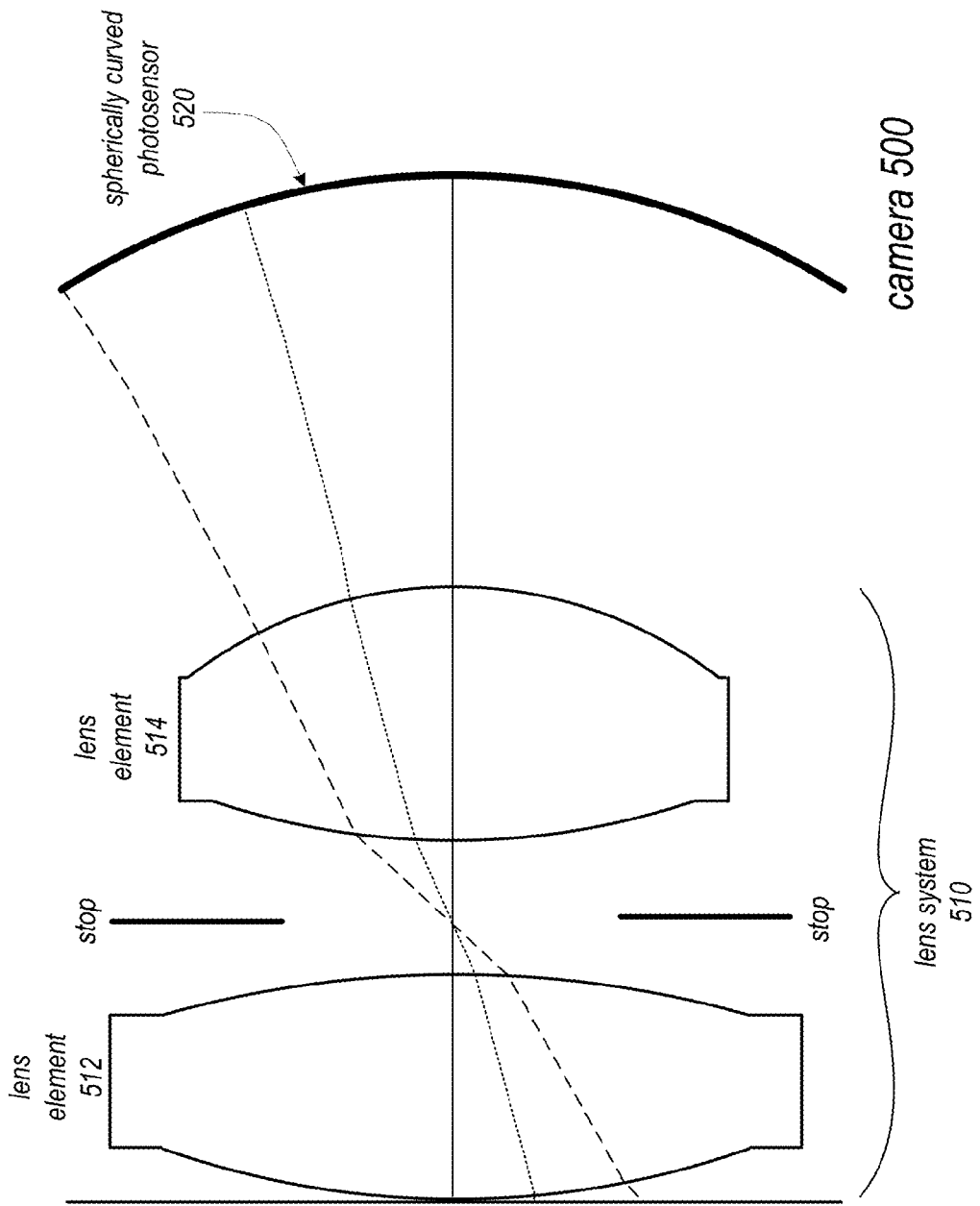
FIG. 5 illustrates an alternative implementation of a camera that includes a lens system with two lens elements and a spherically curved photosensor, according to at least some embodiments.

FIG. 5 illustrates a camera 500 implemented without the third lens element, according to at least some embodiments. Camera 500 may include a lens system 510 that acts as an imaging lens for the camera, and a spherically curved photosensor 520 onto which lens system 510 projects an image at a spherically curved image plane that substantially coincides with the concave surface of the photosensor 520. Lens system 510 includes two lens elements: lens elements 512 and 514. A stop is located between lens elements 512 and 514. In some embodiments, lens elements 512 and 514, photosensor 520, and the stop may be similar or identical to the corresponding lens element 412 and 414, photosensor 420, and stop shown and described in FIGS. 4A and 4B. However, the components of the camera 500 may be appropriately adjusted in spacing, size, optical characteristics, material, or other aspects to provide necessary or desired optical performance in camera 500.

Figure 9:
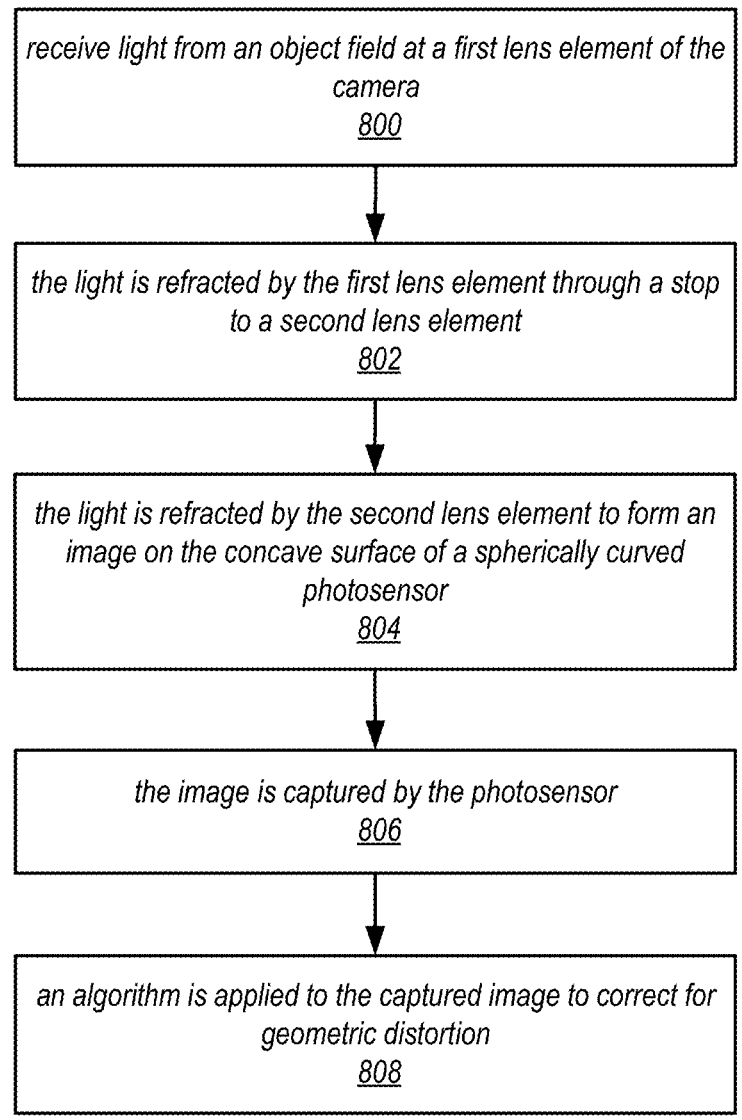
FIG. 9 is a flowchart of a method for capturing images using a camera as illustrated in FIG. 5, according to at least some embodiments.

FIG. 9 is a flowchart of a method for capturing images using a camera as illustrated in FIG. 5, according to at least some embodiments. As indicated at 900, light from an object field in front of the camera is received at a first lens element of the camera. As indicated at 902, the first lens element refracts the light through a stop to a second lens element. As indicated at 904, the light is then refracted by the second lens element to form an image at a spherically curved image plane at or near the concave surface of a spherically curved photosensor. As indicated at 906, the image is captured by the photosensor. As indicated at 908, a distortion correction algorithm may then be applied to the captured image to correct for geometric (barrel) distortion. Note that applying the distortion correction algorithm may be optional.

In at least some embodiments, the first and second lens elements are both biconvex lenses that refract light received from an object field in front of the camera and that act together to focus the light rays at the spherically curved image (or focal) plane at focal length f of the lens system.

Distortion Correction

As noted above, images captured with a camera as illustrated in FIGS. 1 through 5 may include barrel distortion. A distortion correction algorithm may be applied to the images to correct for the distortion. The distortion correction algorithm may be implemented in software and/or hardware in a device that includes the camera. An example device is shown as computer system 2000 in FIG. 10. In some embodiments, the camera may include processor(s) and memory that store program instructions for implementing a distortion correction algorithm specifically designed to correct for the distortion in images captured by the camera. For example, the camera may be implemented as a stand-alone camera system that includes hardware and/or software that can correct for the distortion in captured images in-camera. Alternatively, the camera may be implemented as a stand-alone camera, and the captured images may be transferred via a wired or wireless connection to another device which performs distortion correction.

In at least some embodiments, the camera may be implemented as a component in a multipurpose device such as a smartphone, tablet or pad computing device, laptop or notebook computing devices, desktop computer, and so on. In these implementations, the camera may include processor(s) and memory that store program instructions for implementing a distortion correction algorithm, or alternatively the distortion correction algorithm may be implemented and executed by the host device. In the latter case, custom distortion correction software may be provided with the camera, or alternatively general-purpose image processing software capable of correcting barrel distortion in images may be used.

Other Applications

In addition to imaging applications, the lens system design, for example as illustrated in FIGS. 1 through 5, may be used in illumination and projection applications. In these applications, in place of the spherically curved photosensor, a device that includes the lens system would include a spherically curved light source, for example an array of lasers (e.g., vertical cavity surface emitting laser (VCSEL) technology lasers) or of light-emitting diodes (LEDs) arranged according to a spherically curved shape (see FIG. 6). Thus, the photosensor is replaced by a light source, and the object field becomes a projection field. The lens system acts in reverse, refracting light received from the light source to project a pattern of light onto the projection field.

Example Computing Device

Figure 10:
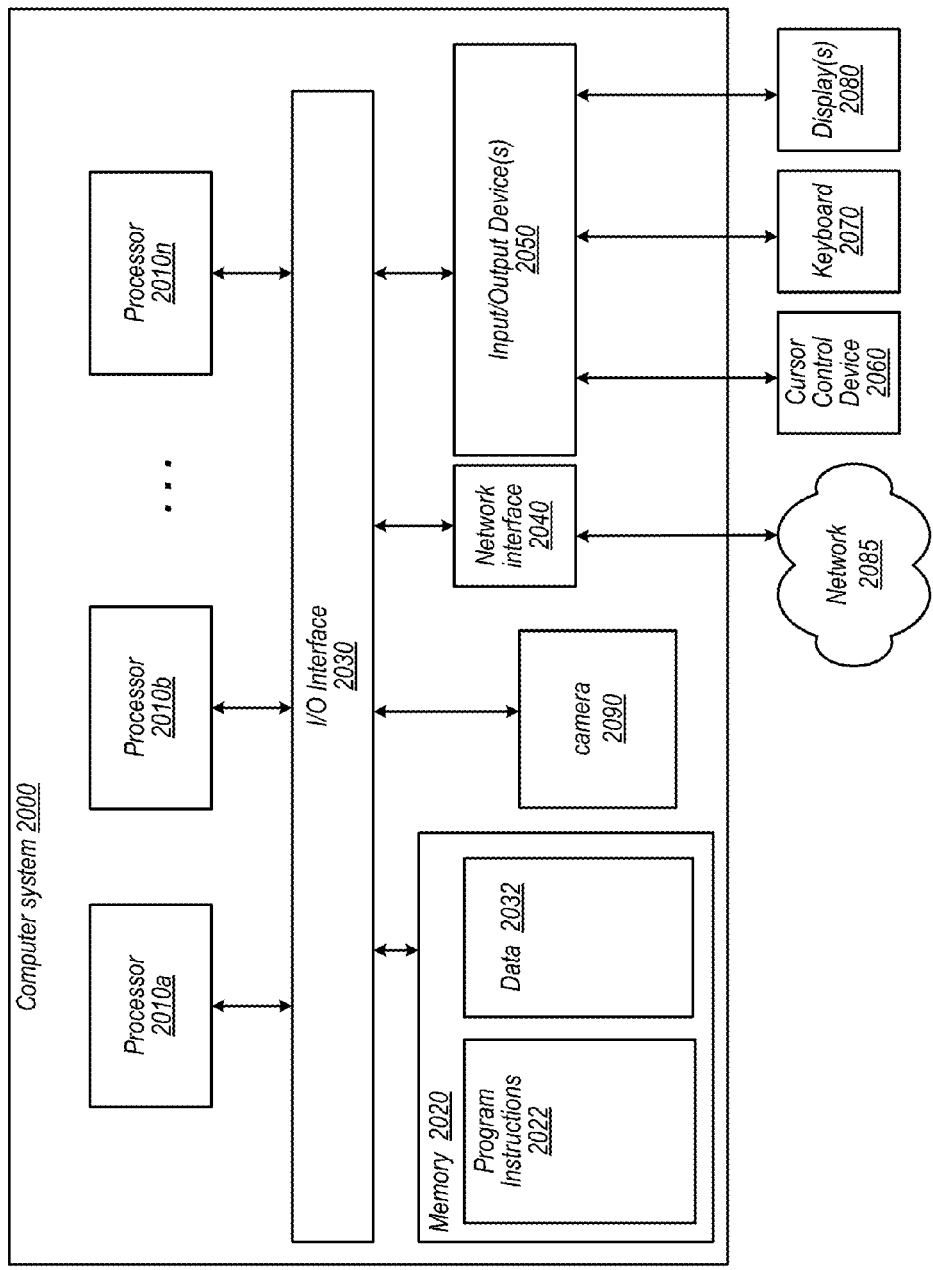
FIG. 10 illustrates an example computer system that may be used in embodiments.

FIG. 10 illustrates an example computing device, referred to as computer system 2000, that may include or host embodiments of the camera as illustrated in FIGS. 1 through 9. In addition, computer system 2000 may implement methods for controlling operations of the camera and/or for correcting distortion in images captured with the camera, as described above. In different embodiments, computer system 2000 may be any of various types of devices, including, but not limited to, a personal computer system, desktop computer, laptop, notebook, tablet or pad device, slate, or netbook computer, mainframe computer system, handheld computer, workstation, network computer, a camera, a set top box, a mobile device, a wireless phone, a smartphone, a consumer device, video game console, handheld video game device, application server, storage device, a television, a video recording device, a peripheral device such as a switch, modem, router, or in general any type of computing or electronic device.

In the illustrated embodiment, computer system 2000 includes one or more processors 2010 coupled to a system memory 2020 via an input/output (I/O) interface 2030. Computer system 2000 further includes a network interface 2040 coupled to I/O interface 2030, and one or more input/output devices 2050, such as cursor control device 2060, keyboard 2070, and display(s) 2080. Computer system 2000 may also include one or more cameras 2090 as described above with respect to FIGS. 1 through 9, which may also be coupled to I/O interface 2030.

In various embodiments, computer system 2000 may be a uniprocessor system including one processor 2010, or a multiprocessor system including several processors 2010 (e.g., two, four, eight, or another suitable number). Processors 2010 may be any suitable processor capable of executing instructions. For example, in various embodiments processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

System memory 2020 may be configured to store program instructions 2022 and/or data 2032 accessible by processor 2010. In various embodiments, system memory 2020 may be implemented using any suitable memory technology, such as static random access memory (SRAM), synchronous dynamic RAM (SDRAM), nonvolatile/Flash-type memory, or any other type of memory. In the illustrated embodiment, program instructions 2022 may be configured to implement various interfaces, methods and/or data for controlling operations of camera 2090 and for capturing and processing images with integrated camera 2090 or other methods or data, for example interfaces and methods for capturing, displaying, processing, and storing images captured with camera 2090. In some embodiments, program instructions and/or data may be received, sent or stored upon different types of computer-accessible media or on similar media separate from system memory 2020 or computer system 2000.

In one embodiment, I/O interface 2030 may be configured to coordinate I/O traffic between processor 2010, system memory 2020, and any peripheral devices in the device, including network interface 2040 or other peripheral interfaces, such as input/output devices 2050. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect (PCI) bus standard or the Universal Serial Bus (USB) standard, for example. In some embodiments, the function of I/O interface 2030 may be split into two or more separate components, such as a north bridge and a south bridge, for example. Also, in some embodiments some or all of the functionality of I/O interface 2030, such as an interface to system memory 2020, may be incorporated directly into processor 2010.

Network interface 2040 may be configured to allow data to be exchanged between computer system 2000 and other devices attached to a network 2085 (e.g., carrier or agent devices) or between nodes of computer system 2000. Network 2085 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 2040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 2050 may, in some embodiments, include one or more display terminals, keyboards, keypads, touchpads, scanning devices, voice or optical recognition devices, or any other devices suitable for entering or accessing data by computer system 2000. Multiple input/output devices 2050 may be present in computer system 2000 or may be distributed on various nodes of computer system 2000. In some embodiments, similar input/output devices may be separate from computer system 2000 and may interact with one or more nodes of computer system 2000 through a wired or wireless connection, such as over network interface 2040.

As shown in FIG. 10, memory 2020 may include program instructions 2022, which may be processor-executable to implement any element or action to support integrated camera 2090, including but not limited to distortion correction or other image processing software and interface software for controlling camera 2090. In at least some embodiments, images captured by camera 2090 may be stored to memory 2020. In addition, metadata for images captured by camera 2090 may be stored to memory 2020.

Those skilled in the art will appreciate that computer system 2000 is merely illustrative and is not intended to limit the scope of embodiments. In particular, the computer system and devices may include any combination of hardware or software that can perform the indicated functions, including computers, network devices, Internet appliances, PDAs, wireless phones, pagers, video or still cameras, etc. Computer system 2000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system 2000 via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 2000 may be transmitted to computer system 2000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

What is claimed is:

1. A camera, comprising:
    a spherically curved photosensor configured to capture light projected onto a concave surface of the photosensor; and
    a lens system configured to refract light from an object field located in front of the camera to form an image of the scene at a spherically curved image plane proximate to the concave surface of the photosensor;
    wherein effective focal length f of the lens system is within 20% of the radius of curvature of the photosensor.

2. The camera as recited in claim 1, wherein the lens system is diffraction-limited over the entire image plane.

3. The camera as recited in claim 1, wherein chief rays of the lens system are substantially normal to the concave surface of the photosensor.

4. The camera as recited in claim 1, wherein F/number of the lens system is 1.8 or less.

5. The camera as recited in claim 1, wherein paraxial image height of the image formed on the concave surface of the photosensor by the lens system is substantially equal to $f*\theta$, where $\theta$ is the deflection angle of the lens system.

6. The camera as recited in claim 1, wherein total axial length of the camera is 2.0 millimeters or less.

7. The camera as recited in claim 1, wherein the lens system comprises:
    a first lens element and a second lens element; and
    a stop positioned between the first and second lens elements;
    wherein the first lens element is configured to refract the light from the object field through the stop to the second lens element; and
    wherein the second lens element is configured to refract the light received from the first lens element to form the image of the scene at the spherically curved image plane proximate to the concave surface of the photosensor.

8. The camera as recited in claim 7, wherein the first and second lens elements are biconvex lenses.

9. The camera as recited in claim 7, wherein the lens system further comprises a third lens element positioned between the second lens element and the photosensor and configured to correct for chromatic aberration of the lens system.

10. The camera as recited in claim 1, wherein pixel size of the photosensor is 1.2 microns or less.

11. The camera as recited in claim 1, wherein the photosensor comprises an array of pixel elements on the concave surface operable to capture images of at least one megapixel resolution.

12. The camera as recited in claim 1, wherein the camera further comprises a component configured to correct for geometric distortion in images captured with the photosensor.

13. A device, comprising:
one or more processors;
a camera comprising:
- a spherically curved photosensor configured to capture light projected onto a concave surface of the photosensor; and
- a diffraction-limited lens system configured to refract light from an object field located in front of the camera to form an image of the scene at a spherically curved image plane proximate to the concave surface of the photosensor, wherein paraxial image height of the image formed on the concave surface of the photosensor by the lens system is substantially equal to $f*\theta$, where $\theta$ is the deflection angle of the lens system; and a memory comprising program instructions executable by at least one of the one or more processors to correct for geometric distortion in images captured by the camera.

14. The device as recited in claim 13, wherein F/number of the lens system is 1.8 or less.

15. The device as recited in claim 13, wherein total axial length of the camera is 2.0 millimeters or less, and wherein pixel size of the photosensor is 1.2 microns or less.

16. The device as recited in claim 13, wherein the lens system comprises:
- a first lens element configured to refract the light from the object field through a stop; and
- a second lens element configured to refract the light received from the first lens element to form the image of the scene at the spherically curved image plane proximate to the concave surface of the photosensor.

17. The device as recited in claim 16, wherein the lens system further comprises a third lens element positioned between the second lens element and the photosensor and configured to correct for chromatic aberration of the first and second lens elements.

18. A method for capturing images, comprising:
- receiving light from an object field in front of a camera at a lens system of the camera;
- refracting light from the lens system to form an image at a spherically curved image plane at or near a concave surface of a spherically curved photosensor, wherein effective focal length f of the lens system is within 20% of the radius of curvature of the photosensor; and
- capturing the image at the concave surface of the spherically curved photosensor.

19. The method as recited in claim 18, wherein the lens system is diffraction-limited over the entire image plane, and wherein chief rays of the lens system are substantially normal to the concave surface of the photosensor.

20. The method as recited in claim 18, wherein said refracting light from the lens system to form an image at a spherically curved image plane at or near a concave surface of a spherically curved photosensor comprises:
- receiving light at a first lens element of the lens system, wherein the first lens element is a biconvex lens;
- refracting light from the first lens element through a stop to a second lens element, wherein the second lens element is a biconvex lens;
- refracting light from the second lens element to form an image at the spherically curved image plane at or near the concave surface of the spherically curved photosensor.

* * * * *